(12) United States Patent
Sun et al.

(10) Patent No.: US 9,078,331 B2
(45) Date of Patent: Jul. 7, 2015

(54) PHOSPHOR-CONVERTED WHITE LED WITH LOW DEVIATION OF CORRELATED COLOR TEMPERATURE AND COLOR COORDINATES AND METHOD OF PREPARING THE SAME

(71) Applicant: NATIONAL CENTRAL UNIVERSITY, Taoyuan County (TW)

(72) Inventors: Ching-Cherng Sun, Taoyuan County (TW); Ching-Yi Chen, New Taipei (TW); Hsin-Mei Wu, Kaohsiung (TW); Cheng-Chien Chen, Yilan County (TW)

(73) Assignee: National Central University, Taoyuan County (TW)

( * ) Notice: Subject to any disclaimer, the term of this patent is extended or adjusted under 35 U.S.C. 154(b) by 3 days.

(21) Appl. No.: 13/903,190

(22) Filed: May 28, 2013

(65) Prior Publication Data

US 2013/0257265 A1    Oct. 3, 2013

Related U.S. Application Data

(63) Continuation-in-part of application No. 13/233,779, filed on Sep. 15, 2011, now abandoned.

(51) Int. Cl.
*H05B 33/14*    (2006.01)
*H05B 33/10*    (2006.01)
*H01L 33/50*    (2010.01)
*C09K 11/77*    (2006.01)

(52) U.S. Cl.
CPC ............... *H05B 33/14* (2013.01); *H05B 33/10* (2013.01); *H01L 33/502* (2013.01); *H01L 2933/0041* (2013.01); *C09K 11/7774* (2013.01); *Y02B 20/181* (2013.01)

(58) Field of Classification Search
CPC .... H05B 33/14; H05B 33/10; C09K 11/7774; H01L 33/502; H01L 2933/0041
See application file for complete search history.

(56) References Cited

U.S. PATENT DOCUMENTS

2007/0247829 A1    10/2007    Fiedler et al.

*Primary Examiner* — Anne Hines
(74) *Attorney, Agent, or Firm* — Rosenberg, Klein & Lee

(57) ABSTRACT

A light emitting device is provided to produce white light with a stable correlated color temperature and stable color coordinates. The light emitting device includes a blue LED chip and a yellow phosphor. The blue LED chip has a peak wavelength X slightly smaller than the peak wavelength Y of the phosphor such that when the light emitting device is subjected to a predetermined operating current, the phosphor decays due to thermal effect, and the LED chip has its emission spectrum red-shifted to substantially match with the excitation spectrum of the phosphor. At this time, the excitation ability of the LED chip is increased and causes an increase of yellow power output from the phosphor that substantially compensates a decrease of yellow light output caused by the phosphor.

3 Claims, 8 Drawing Sheets

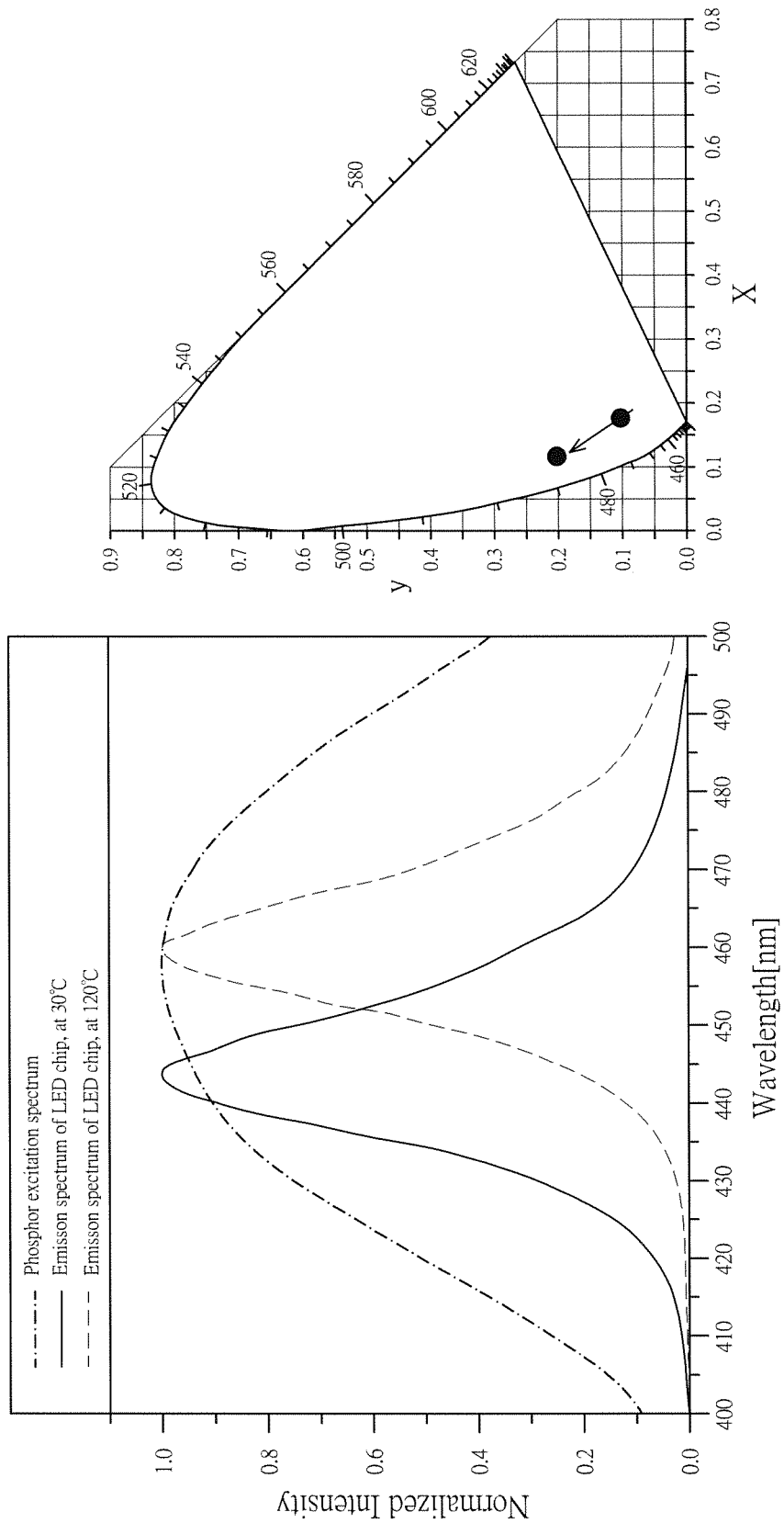

US 9,078,331 B2

PHOSPHOR-CONVERTED WHITE LED WITH LOW DEVIATION OF CORRELATED COLOR TEMPERATURE AND COLOR COORDINATES AND METHOD OF PREPARING THE SAME

CROSS-REFERENCE TO RELATED APPLICATION

This is a continuation-in-part of co-pending application Ser. No. 13/233,779, filed Sep. 15, 2011, currently pending.

BACKGROUND OF THE INVENTION

1. Field of the Invention

The present invention relates to a white light emitting device, and more particularly to a phosphor-converted white light emitting device with low deviation of correlated color temperature and color coordinates, and preparing of the same.

2. Description of the Related Art

From normal using of LED light source to see, the leading factor that affects lifetime of the light source is heat. It is an important problem that LED lighting current faces. Due to the heat, the LED light source may degrade in brightness and change in color over time. The phosphor utilized for the wavelength conversion ages over the lifetime of the light source. This aging results in a decrease in the efficiency with which the activation light is converted. Hence, the ratio of blue to yellow light changes over the lifetime of the device as the phosphor ages. And this leads to an undesirable color shift in the light source.

As discussed in U.S. Patent Pub. No. 2007/0247829, a prior art white LED comprising a blue primary source and the phosphors YAG:Ce combined with dark-red sulfide phosphor (Sr, Ca) S:Eu, shows a considerable amount of color drift after 1000 hours due to the unstable phosphor. This results in its color temperature being altered from 3275 to 3575 K, as depicted in FIG. 7 of the patent reference. Correspondingly, the drift in the y color coordinate over 1000 hours operating time at 85° C. and 85% relative humidity is also considerable, cf. FIG. 8 of the patent reference.

Although a general multichip RGB with proper dominant wavelengths and proper intensity proportions can provide easy color management, it is still not easy to stabilize a specific chromaticity over time while LED junction temperatures change from ambient temperature of 30° C. to 120° C. or higher because individual LED exhibits different thermal dependencies.

To deal with these thermal issues, one may use optical and thermal feedback or feed-forward circuit to maintain the chromaticity to within one MacAdam ellipse, especially if the luminaire is being dimmed while the LED junction temperatures vary rapidly. Nevertheless, the approach is too expensive to be adopted in practice. There is a need to find a better solution for a stable white LED with low deviation of correlated color temperature and color coordinates.

SUMMARY OF THE INVENTION

To solve the problems mentioned above, it is an objective of the present invention to provide a light emitting device that produces white light with a stable correlated color temperature and color coordinates.

To achieve the foregoing objective, the light emitting device includes a blue LED chip and a yellow phosphor. The blue LED chip emits light with an emission spectrum having a peak wavelength X. The yellow phosphor has an excitation spectrum with a peak wavelength Y and is configured to convert part of light emitted from the LED chip. In particular, the peak wavelength X of the blue LED chip is slightly smaller than the peak wavelength Y of the phosphor to such an extent that when the light emitting device is subjected to a predetermined operating current, the phosphor decays due to thermal effect, and the LED chip has its emission spectrum red-shifted to substantially match with the excitation spectrum of the phosphor. This increases the excitation ability of the LED chip and induces the phosphor to contribute an increase of emission output power that substantially equals a decrease of emission output power caused by the thermal effect on the phosphor. Thus, the CCT and the color coordinates of the light emitting device are maintained.

Another object in accordance with the present invention is the provision of a method for preparing the white light emitting device.

Specifically, the method includes the following steps:

providing a blue LED chip and a yellow phosphor for converting part of blue light emitted from the LED chip to yellow; wherein the LED chip has an initial emission spectrum with a peak wavelength X slightly smaller than a peak wavelength Y of an excitation spectrum of the phosphor;

measuring a decay rate of an emission output power of the phosphor from an ambient temperature to a LED junction temperature of about 120° C.;

measuring a red-shifted emission spectrum of the LED chip at the LED junction temperature of about 120° C.;

calculating an excitation ability of the blue LED chip according to the initial emission spectrum of the LED chip and the excitation spectrum of the phosphor, wherein the excitation ability of the LED chip is calculated by the following formulas:

$$Power_{total} = \int P_{barechip}(\lambda)d\lambda$$

$$P_{barechip\_N}(\lambda) = \frac{P_{barechip}(\lambda)}{Power_{total}}$$

$$\text{Excitation\_ability} = \int P_{excitation}(\lambda)P_{barechip\_N}(\lambda)d\lambda$$

where $P_{excitation}(\lambda)$ is the phosphor excitation spectrum; $P_{barechip}(\lambda)$ is the LED chip emission spectrum; and $P_{barechip\_N}(\lambda)$ is the normalized LED chip emission spectrum;

calculating an excitation ability of the blue LED chip according to the measured red-shifted emission spectrum of the LED chip and the excitation spectrum of the phosphor, wherein the excitation ability of the LED chip is calculated by the aforementioned formulas;

determining whether an increase rate of the excitation ability of the LED chip substantially equals a decay rate of emission output power of the phosphor; and if yes, the LED chip is qualified to be packaged with the phosphor to form the light emitting device that produces white light with a stable correlated color temperature (CCT) and stable color coordinates.

Further benefits and advantages of the present invention will become apparent after a careful reading of the detailed description with appropriate reference to the accompanying drawings.

BRIEF DESCRIPTION OF THE DRAWINGS

FIG. 3A illustrates an emission spectrum of a LED bare chip is red-shifted to match with the emission spectrum of the YAG phosphor;

FIG. 3B illustrates the color shift of the LED bare chip;

DETAILED DESCRIPTION OF EMBODIMENTS

Accordance with the preferred embodiment of the present invention, a light emitting device that produces white light with a stable correlated color temperature (CCT) and stable color coordinates is provided. The light emitting device includes generally a blue lighting emitting diode (LED) chip and a yellow phosphor for converting part of blue light emitted from the LED chip. The blue LED chip emits the light with an emission spectrum having a peak wavelength X. The yellow phosphor has an excitation spectrum with a peak wavelength Y. In particular, the peak wavelength X of the blue LED chip is slightly smaller than the peak wavelength Y of the phosphor, which is one of the key factors for preparing the light emitting device with a stable color temperature and color coordinates, and will be explained in detail hereinafter.

Figure 1A:
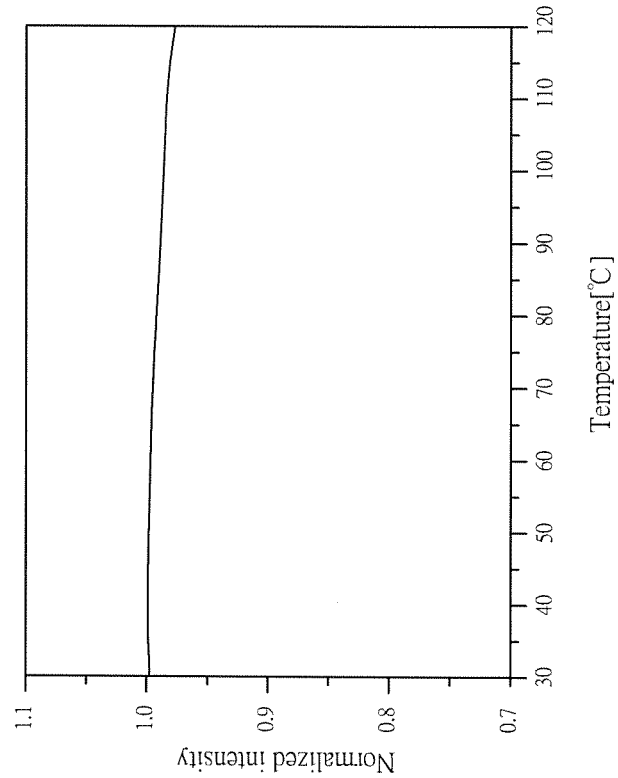
FIG. 1A illustrates the emission spectrum shift of the YAG phosphor over a temperature range of 30° C. to 110° C.
Figure 1B:
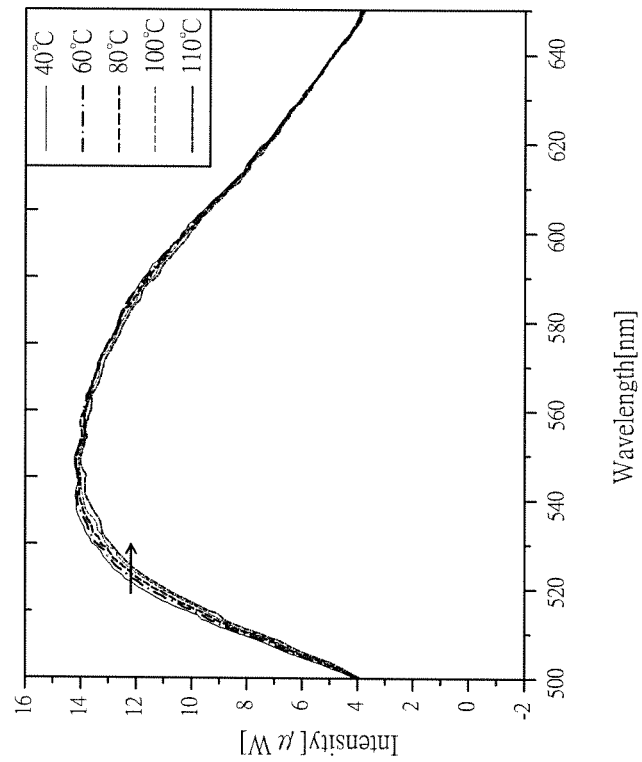
FIG. 1B illustrates the thermal decay of the YAG phosphor over the temperature range of 30° C. to 120° C.
Figure 1C:
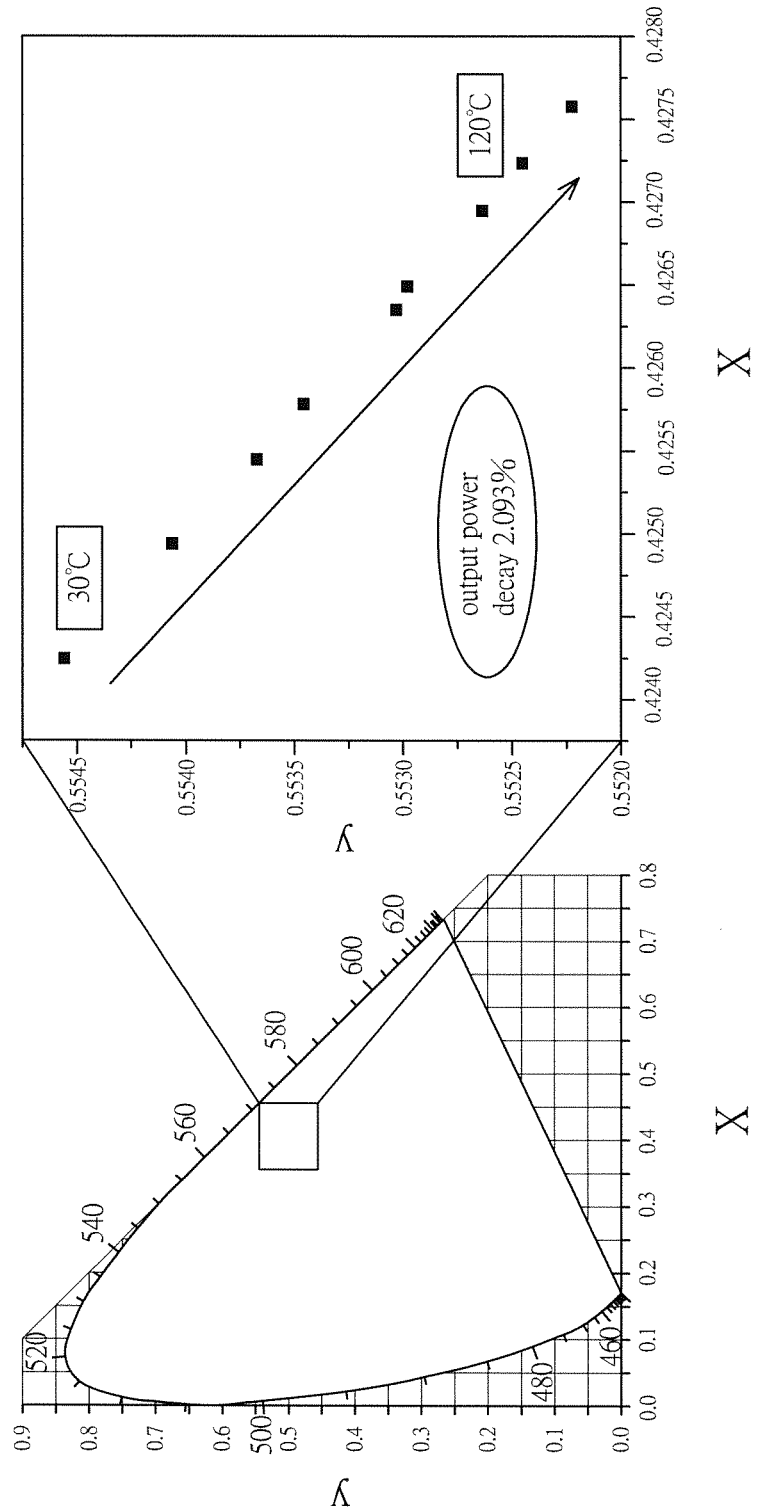
FIG. 1C illustrates the color shift of the YAG phosphor.

It is measured and found out that the phosphor decays over a range of temperatures (30☐ to 120° C.), as shown in FIGS. 1A and 1B, and therefore causes color shift, as shown in FIG. 1C. The output power decay rate of the phosphor is measured under a condition where the phosphor is heated by a heater and is irradiated with a laser beam with a specific wavelength similar to a peak wavelength of LED.

Figure 2:
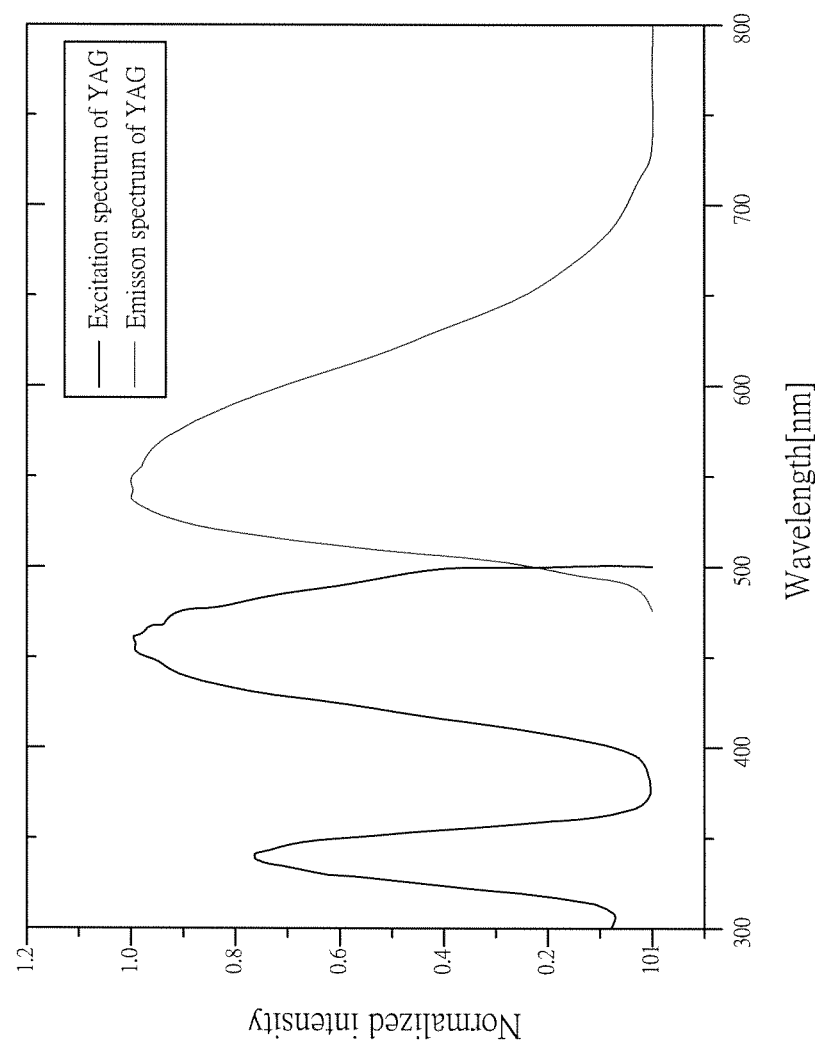
FIG. 2 illustrates an emission spectrum and an emission spectrum of the YAG phosphor.

FIG. 2 illustrates an excitation spectrum of YAG phosphor with a peak wavelength of 460 nm, and an emission spectrum of the YAG phosphor. That is, the YAG phosphor converts part of light from LED to yellow to form the emission spectrum. It is noted that a conventional phosphor-converted white light emitting device may employ a LED chip with a peak wavelength generally equal to 460 nm in order to exactly match the excitation spectrum of YAG phosphor which has the peak wavelength of 460 nm. This leads to an undesirable color shift as the YAG phosphor ages as mentioned in the Background section.

To solve the color shift problem, the thermal effect factor is well taken into account for preparing the light emitting device with stable CCT and color coordinates according to the present invention. Specifically, the LED chip of the present invention is specially selected to have its peak wavelength X slightly smaller than the peak wavelength Y of the phosphor to such an extent that when the light emitting device is subjected to a predetermined operating current, such as 350 mA, the phosphor decays due to thermal effect, and the LED chip has its emission spectrum red-shifted to substantially match with the excitation spectrum of the phosphor.

For instance, as shown in FIG. 3A, the peak wavelength of the phosphor excitation spectrum is about 460 nm, and when the emission spectrum of a LED bare chip with a peak wavelength of 443 nm is operated under the operating current of 350 mA, the LED junction temperature will change from ambient temperature (of 30° C.) to 120° C. so that the emission spectrum of the LED bare chip is red-shifted to have a peak wavelength of about 460 nm that substantially equals the peak wavelength (460 nm) of the phosphor excitation spectrum. On the other hand, the color coordinates of the device shift, as given by FIG. 3B. It should be noted that, in other cases, a red-shifted peak wavelength of a LED bare chip does not have to be exactly equals the peak wavelength of the phosphor excitation spectrum as long as the red-shifted emission spectrum of the LED bare chip has its excitation ability increased, which can therefore induce the phosphor to contribute an increase of emission output power that substantially equals a decrease of emission output power caused by the thermal effect on the phosphor.

Figure 4A:
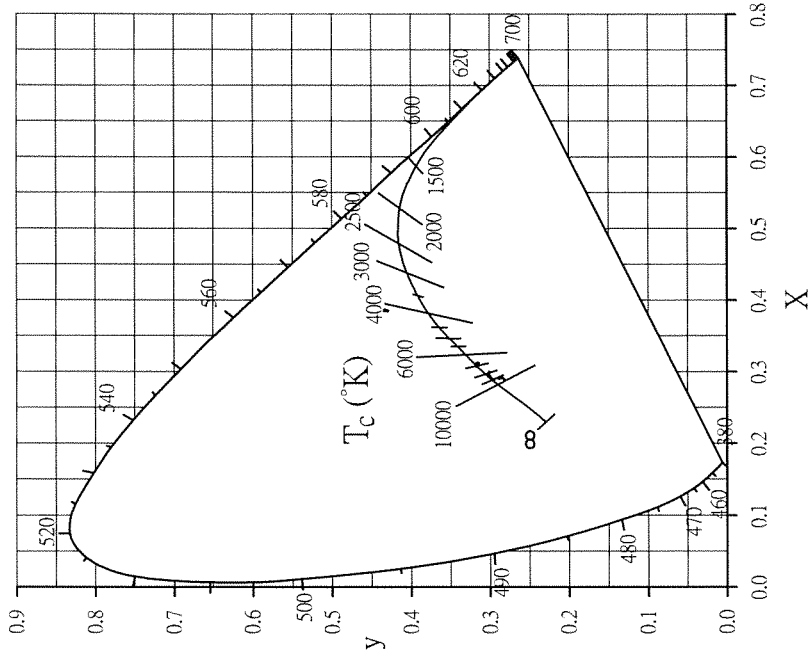
FIG. 4A illustrates the relatively stable color coordinates of various light emitting devices, showing that an increase of emission output power substantially equals a decrease of emission output power caused by the thermal effect on the phosphor.
Figure 4B:
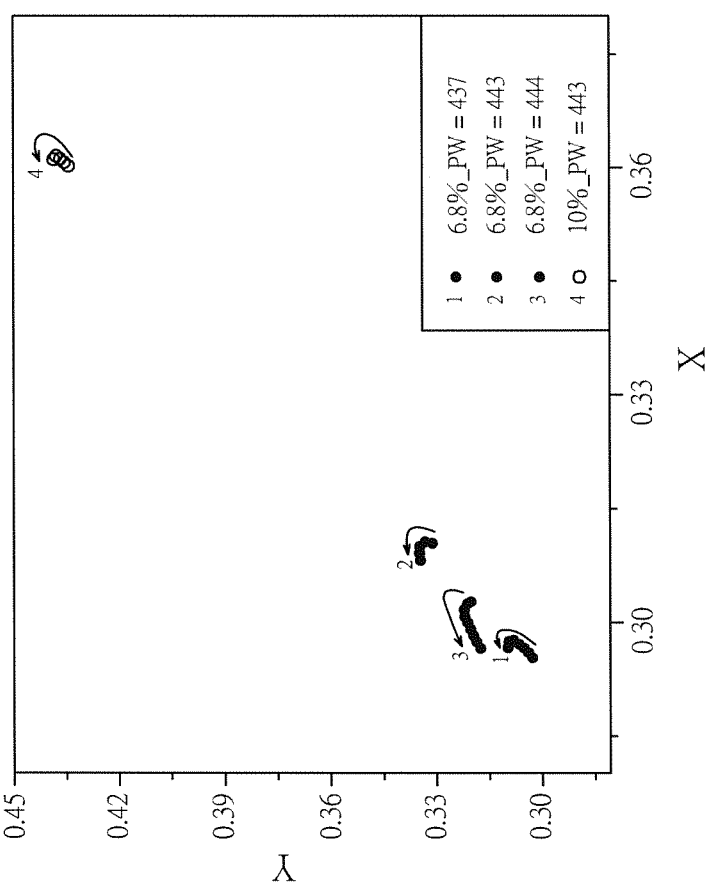
FIG. 4B illustrates the relatively stable CCT of the light emitting devices in FIG. 4A.

To find a qualified light emitting device having good color performance, many experiments have been done. As shown in FIG. 4A, four LED chips each having a peak wavelength of 443 nm, 444 nm or 447 nm are packaged with YAG-based phosphors having different concentrations, namely 6.8% and 10%, and are measured under the operating current of 350 mA. The color coordinate data measured from an initial temperature of 30° C. to a higher LED junction temperature of 120° C. are directed by the arrows. In these cases, the packaged LEDs can have stable color temperatures (FIG. 4B) and stable color coordinates (FIG. 4A) because the red-shifted emission spectrum of each of the LED bare chip induces the respective phosphor to contribute an increase of emission output power that substantially equals a decrease of emission output power caused by the thermal effect on the phosphor. That is to say, the gain of the excitation ability, as will be discussed later, is substantially equal to the thermal effect on the phosphors.

Figure 5B:
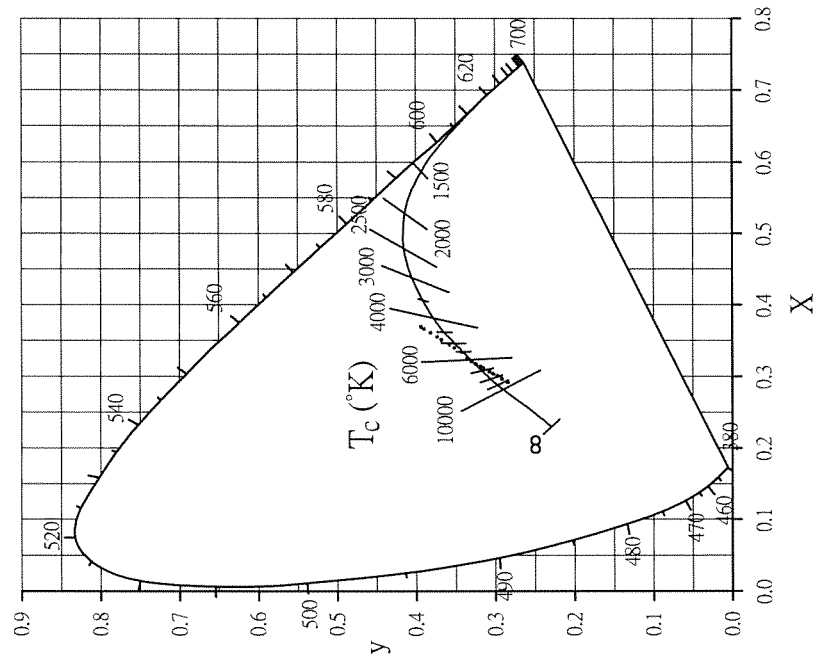
FIG. 5B illustrates the relatively large CCT shift of the light emitting devices in FIG. 5A.
Figure 5A:
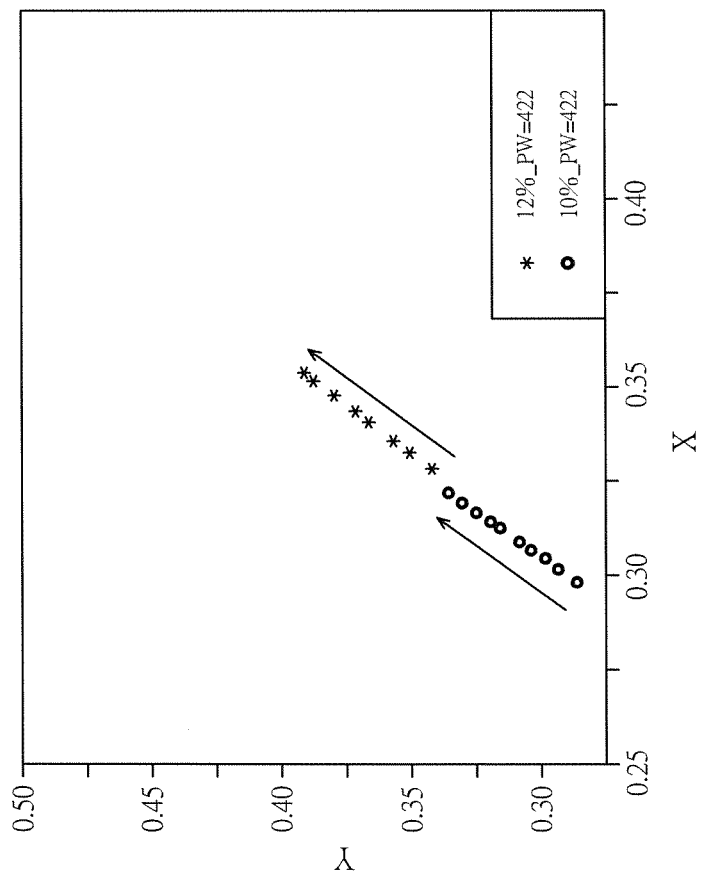
FIG. 5A illustrates the relatively large color shift of various light emitting devices, showing that an increase of emission output power larger than a decrease of emission output power caused by the thermal effect on the phosphor.

However, as shown in FIG. 5A, two LED chips each having a peak wavelength of 422 nm are packaged with YAG-based phosphors having different concentrations, namely 10% and 12%, and are measured under the operating current of 350 mA. The color coordinate data measured from an initial temperature of 30° C. to a higher LED junction temperature of 120° C. are directed by the arrows. In these cases, the color coordinates seriously shift to the right top as indicated in FIG. 5A, and the correlated color temperatures are decreased as indicated in FIG. 5B. This shows a considerable amount of color drift because the gain of the excitation ability is larger than the thermal effect on the phosphors.

Figure 6B:
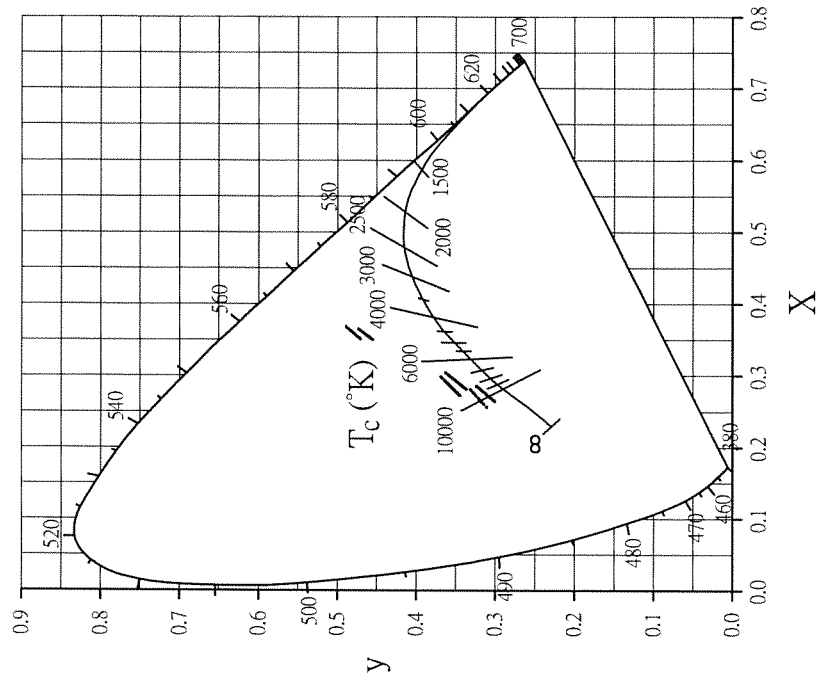
FIG. 6B illustrates the relatively large CCT shift of the light emitting devices in FIG. 6A.
Figure 6A:
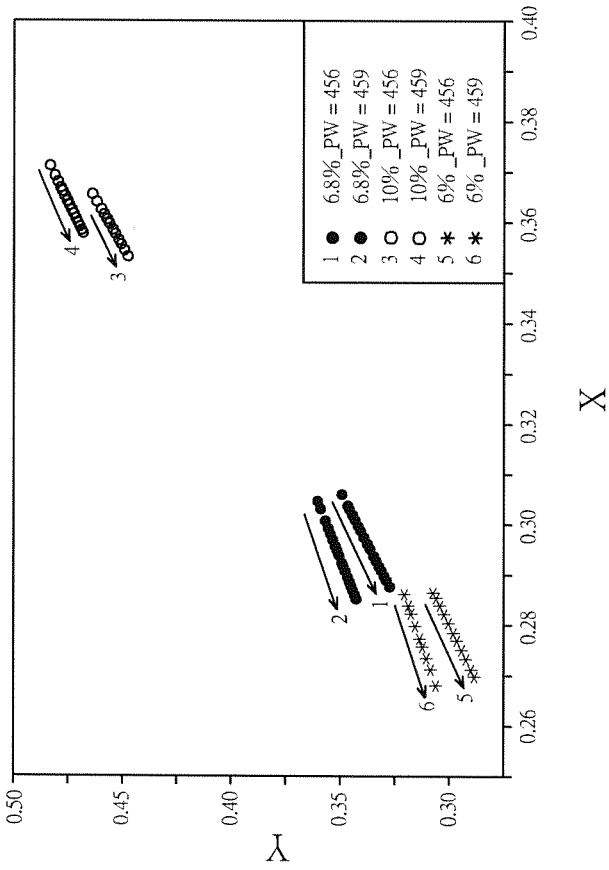
FIG. 6A illustrates the relatively large color shift of various light emitting devices, showing that an increase of emission output power smaller than a decrease of emission output power caused by the thermal effect on the phosphor.

In contrast, as shown in FIG. 6A, a plurality of LED chips each having a peak wavelength of 456 nm or 459 nm are packaged with YAG-based phosphors having different concentrations, namely 6.8%, 10%, and 6%, and are measured under the operating current of 350 mA. The color coordinate data measured from an initial temperature of 30° C. to a higher LED junction temperature of 120° C. are directed by the arrows. In these cases, the color coordinates seriously shift to the left down as indicated in FIG. 6A, and the correlated color temperature rises as indicated in FIG. 6B. This also shows a considerable amount of color drift because the gain of the excitation ability is smaller than the thermal effect on the phosphors.

According to the experiments described above, it is concluded that in the condition where the phosphor is Cerium-doped Yttrium Aluminum Garnet YAG:Ce) with the peak wavelength Y of about 460 nm; the peak wavelength X of the LED chip is in the range of 437 nm to 455 nm; and the light emitting device is configured to be driven with the operating current of 350 mA, the color performances are acceptable and comply with the color shift tolerance criteria of 6%.

Figure 7:
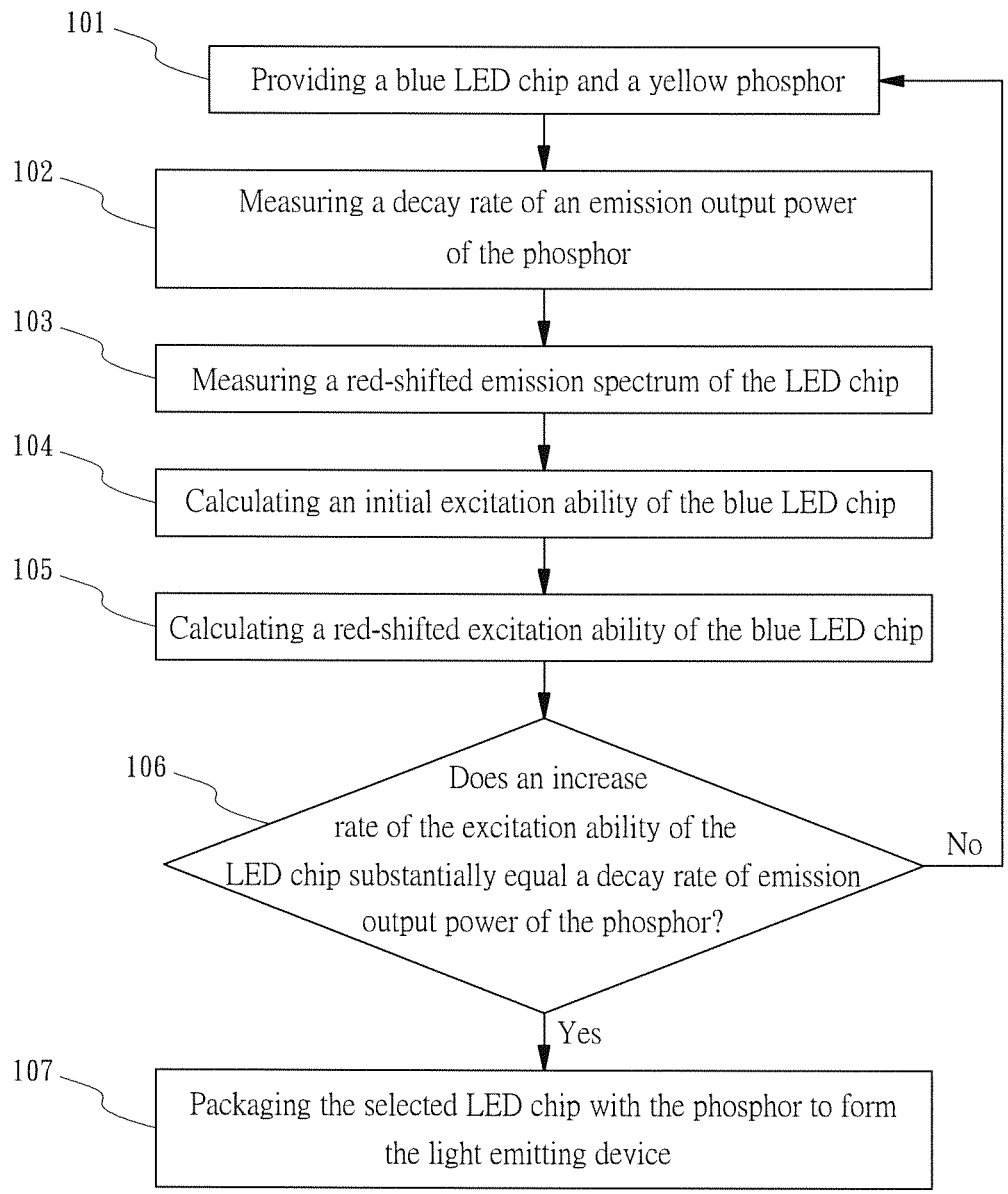
FIG. 7 is a flow diagram illustrating a method of preparing a light emitting device according to the present invention.

With reference to FIG. 7, a method of preparing a light emitting device that produces white light with a stable correlated color temperature (CCT) and stable color coordinates is provided. The method comprises the following steps:

Firstly, in Step 101, a blue LED chip and a yellow phosphor with a specific concentration are provided. The yellow phosphor, such as YAG:Ce, is provided for converting part of blue light emitted from the LED chip to yellow. And the LED chip has an initial emission spectrum with a peak wavelength X slightly smaller than a peak wavelength Y of the excitation spectrum of the phosphor. For instance, the peak wavelength X of the LED chip is 441 nm or 443 nm, which is smaller that the peak wavelength Y of about 460 nm, and the yellow phosphor has a certain concentration, such as 6.8%, 10% or 12%. The LED chip is driven with the operating current of 350 mA.

Next, in Step 102, a decay rate of an emission output power of the phosphor from an ambient temperature of about 30° C. to a LED junction temperature of about 120° C. is measured. The decay rate of the phosphor is measured while the phosphor is heated by a heater and is irradiated with a laser beam having a wavelength, such as 441 nm or 443 nm, substantially equal to the peak wavelength X of the LED chip. On the other hand, in Step 103, a red-shifted emission spectrum of the LED chip at the LED junction temperature of about 120° C. is measured.

Then, in Step 104, a first initial excitation ability of the blue LED chip may be calculated according to a combination of the initial emission spectrum of the LED chip and the excitation spectrum of the phosphor; and in Step 105, a second red-shifted excitation ability of the blue LED chip may be calculated according to a combination of the measured red-shifted emission spectrum of the LED chip and the excitation spectrum of the phosphor. It is noted that the excitation ability of the LED chip is calculated and defined by the following formulas:

$$Power_{total} = \int P_{barechip}(\lambda)d\lambda$$

$$P_{barechip\_N}(\lambda) = \frac{P_{barechip}(\lambda)}{Power_{total}}$$

$$Excitation\_ability = \int P_{excitation}(\lambda)P_{barechip\_N}(\lambda)d\lambda$$

where $P_{excitation}(\lambda)$ is the phosphor excitation spectrum; $P_{barechip}(\lambda)$ is the LED chip emission spectrum; and $P_{barechip\_N}(\lambda)$ is the "normalized" LED chip emission spectrum, by using a conventional normalization method.

With the first excitation ability and the second excitation ability of the LED chip, an increase rate of the excitation ability of the LED chip may be calculated to determine whether the increase rate of the excitation ability substantially equals a decay rate of emission output power of the phosphor, as shown in Step 106. As shown in the table below, at least three recipes are found to have their increase rates of the excitation ability of the LED chips substantially equal the decay rates of the emission output power of the phosphors, and their excellent color performance can be found supported by FIG. 4A and FIG. 4B.

|  | No. 1 | No. 2 | No. 3 |
|---|---|---|---|
| Concentration of phosphor | 6.8% | 6.8% | 10% |
| Emission power decay rate of phosphor (from 30° C. to 120° C.) | −0.66% | −0.66% | −1.86% |
| Initial peak wavelength X of LED chip | 443 nm | 444 nm | 443 nm |
| Increase rate of excitation ability (from 30° C. to 120° C.) | +0.44% | +1.11% | +1.0% |

In Step 107, if it is true that the increase rate of the excitation ability substantially equals the decay rate of emission output power of the phosphor, the LED chip is qualified to be packaged with the phosphor to form the light emitting device that produces white light with a stable correlated color temperature (CCT) and stable color coordinates. In contrast, if the answer is no, then go back to Step 101 and choose another LED chip for the phosphor to see if it meets the conditions mentioned above.

It is to be understood that the disclosed embodiments are illustrative in nature and the invention is not to be limited to any one or more embodiments except as set forth in the following claims.

What is claimed is:

1. A method of preparing a light emitting device that produces white light with a stable correlated color temperature (CCT) and stable color coordinates, the method comprising the steps of:

providing a blue LED chip and a yellow phosphor with a specific concentration for converting part of blue light emitted from the LED chip to yellow; wherein the LED chip has an initial emission spectrum with a peak wavelength X slightly smaller than a peak wavelength Y of an excitation spectrum of the phosphor;

measuring a decay rate of an emission output power of the phosphor from an ambient temperature to a LED junction temperature of about 120° C.;

measuring a red-shifted emission spectrum of the LED chip at the LED junction temperature of about 120° C.;

calculating a first excitation ability of the blue LED chip according to a combination of the initial emission spectrum of the LED chip and the excitation spectrum of the phosphor, wherein the excitation ability of the LED chip is calculated by the following formulas:

$$Power_{total} = \int P_{barechip}(\lambda)d\lambda$$

$$P_{barechip\_N}(\lambda) = \frac{P_{barechip}(\lambda)}{Power_{total}}$$

$$Excitation\_ability = \int P_{excitation}(\lambda)P_{barechip\_N}(\lambda)d\lambda$$

where Pexcitation ($\lambda$) is the phosphor excitation spectrum; Pbarechip ($\lambda$) is the LED chip emission spectrum; and Pbarechip_N ($\lambda$) is the normalized LED chip emission spectrum;

calculating a second excitation ability of the blue LED chip according to a combination of the measured red-shifted emission spectrum of the LED chip and the excitation spectrum of the phosphor, wherein the excitation ability of the LED chip is calculated by the aforementioned formulas; and determining whether an increase rate of the excitation ability of the LED chip substantially equals a decay rate of emission output power of the phosphor; and if yes, the LED chip is qualified to be packaged with the phosphor to form the light emitting device that produces white light with a stable correlated color temperature (CCT) and stable color coordinates.

2. The method of claim 1, wherein the yellow phosphor is Cerium-doped Yttrium Aluminum Garnet (YAG:Ce); and the LED chip is driven with the operating current of 350 mA.

3. The method of claim 1, wherein the decay rate of the phosphor is measured while the phosphor is heated by a heater and is irradiated with a laser beam having a wavelength substantially equal to the peak wavelength X of the LED chip.

* * * * *